United States Patent
Choi et al.

(10) Patent No.: US 8,467,262 B2
(45) Date of Patent: Jun. 18, 2013

(54) METHOD OF CONTROLLING NON-VOLATILE MEMORY DEVICE

(75) Inventors: Hyun-Jin Choi, Suwon-si (KR); Chan-Ik Park, Hwaseong-si (KR); Jeong-Woo Lee, Seoul (KR); Sung-Joo Yoo, Pohang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 199 days.

(21) Appl. No.: 13/116,214

(22) Filed: May 26, 2011

(65) Prior Publication Data

US 2011/0292729 A1 Dec. 1, 2011

(51) Int. Cl.
*G11C 8/00* (2006.01)
(52) U.S. Cl.
USPC .................................... 365/230.03
(58) Field of Classification Search
USPC .................................... 365/230.03
See application file for complete search history.

(56) References Cited

U.S. PATENT DOCUMENTS

| 7,567,462 | B2 | 7/2009 | Yamada |
| 7,589,989 | B2 | 9/2009 | Fasoli et al. |
| 2010/0165732 | A1* | 7/2010 | Lee et al. ............... 365/185.11 |

FOREIGN PATENT DOCUMENTS

| JP | 2009-37676 | 2/2009 |
| KR | 10-2005-0007653 | 1/2005 |

OTHER PUBLICATIONS

English Abstract for Publication No. 10-2005-0007653.
English Abstract for Publication No. 2009-37676.

* cited by examiner

*Primary Examiner* — Anthan Tran
(74) *Attorney, Agent, or Firm* — F. Chau & Associates, LLC

(57) ABSTRACT

A method of controlling a non-volatile memory device includes comparing the number of banks that are in operating states with a threshold value. If the number of the banks is smaller than the threshold value, data stored in a standby bank is read. If there is no bank having data to be read, a standby bank is programmed. If the number of the banks is equal to or greater than the threshold value or if the reading or the programming is performed, it is determined whether there is a reading or programming command to be performed. If there is the reading or programming command to be performed, the process is repeated from the comparing step. The programming may include programming of a most significant bit (MSB) page or a least significant bit (LSB) page.

20 Claims, 12 Drawing Sheets

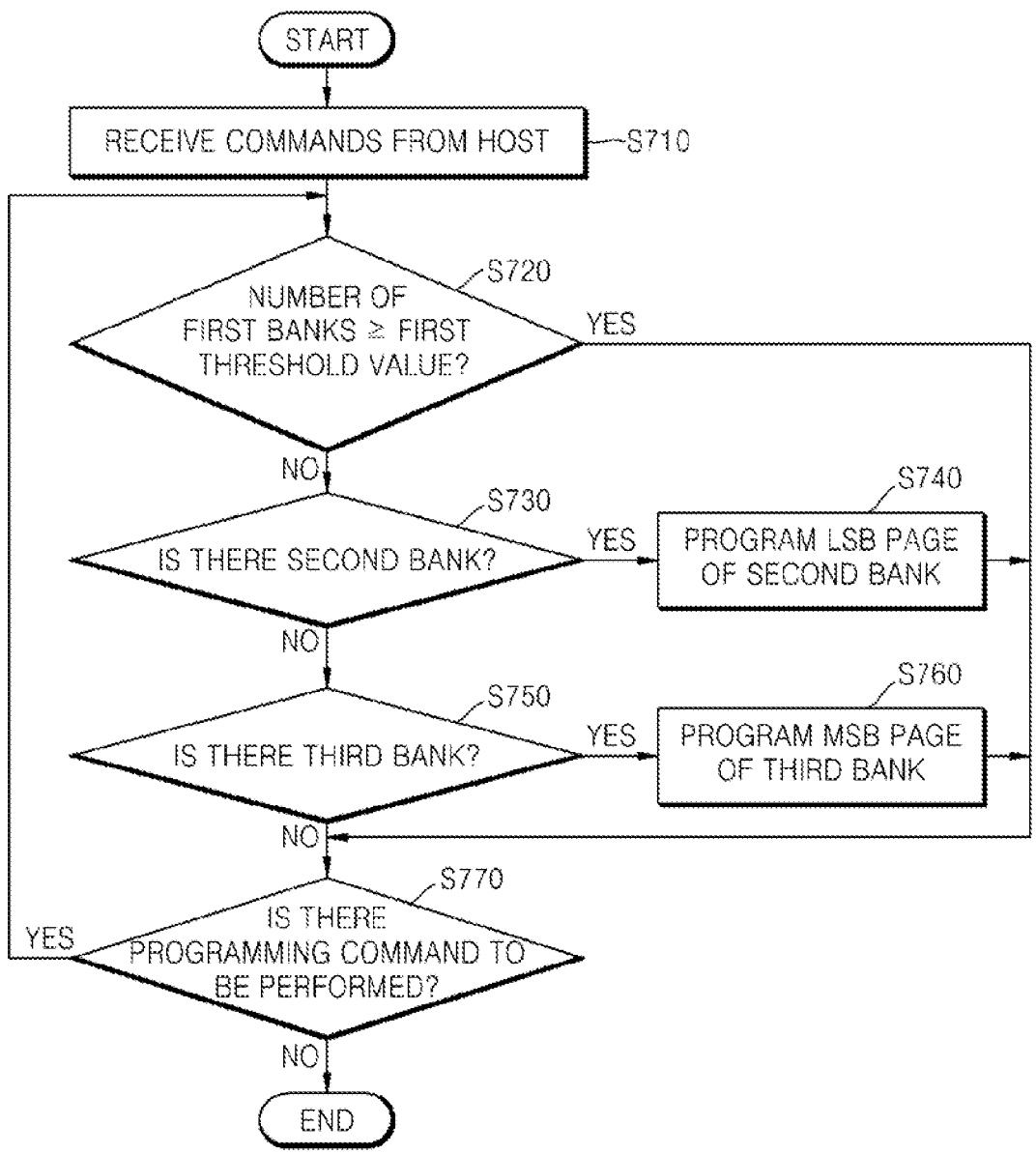

|   | COM |
|---|---|
| 1 | LPG_B3 |
| 2 | MPG_B2 |
| 3 | LPG_B8 |
| 4 | MPG_B4 |

|   | COM |
|---|---|
| 1 | LPG_B3 |
| 2 | MPG_B2 |
| 3 | RD_B5 |
| 4 | LPG_B8 |
| 5 | MPG_B4 |
| 6 | RD_B6 |

METHOD OF CONTROLLING NON-VOLATILE MEMORY DEVICE

CROSS-REFERENCE TO RELATED APPLICATIONS

This application claims the benefit of Korean Patent Application No. 10-2010-0049827, filed on May 27, 2010, in the Korean Intellectual Property Office, the disclosure of which is incorporated herein in its entirety by reference.

BACKGROUND

1. Technical Field

The inventive concept relates to a memory device, and more particularly, to a method of controlling a non-volatile memory device.

2. Discussion of the Related Art

Flash memory is a form of non-volatile memory in which data is stored therein within a plurality of memory cells. When desired, data stored in a cell of flash memory may be electrically erased, and thus, flash memory devices are widely used in computers and memory cards. Flash memory devices may be used instead of hard disk drives in portable information devices such as mobile phones, personal digital assistants (PDAs), and digital cameras. These portable information devices require storage devices of larger capacities in order to provide users with various functions, and accordingly, flash memory devices that may store multi-bit data of two or more bits in one memory cell have been suggested.

SUMMARY

According to an exemplary embodiment of the inventive concept, there is provided a method of controlling a non-volatile memory device including a plurality of banks. The method includes comparing the number of first banks that are in operating states with a first threshold value. If the number of the first banks is smaller than the first threshold value, data stored in a bank that is in a standby state among the plurality of banks is read in response to a corresponding reading command among at least one received command. If there are no banks, data of which is to be read, a bank in the standby state among the plurality of banks is programmed in response to a corresponding programming command among at least one received command. When the number of the first banks is equal to or greater than the first threshold value or when the reading or the programming is performed, it is determined whether there is a reading command to be performed or a programming command to be performed among the at least one received command. If there is the reading command to be performed or the programming command to be performed, the processes is performed again from the comparing step.

According to an aspect of the inventive concept, there is provided a method of controlling a non-volatile memory device including a plurality of banks. The method includes comparing the number of first banks that are in operating states with a first threshold value. If the number of the first banks is smaller than the first threshold value, a bank that is in a standby state among the plurality of banks is programmed in response to a corresponding programming command among at least one received command. If the number of the first banks is equal to or greater than the first threshold value or if the programming is performed, it is determined whether there is a programming command to be performed among the at least one received command. If there is the programming command to be performed, the process is performed again from the comparing step.

BRIEF DESCRIPTION OF THE DRAWINGS

Exemplary embodiments of the inventive concept will be more clearly understood from the following detailed description taken in conjunction with the accompanying drawings in which:

FIG. 7 is a flowchart illustrating a method of controlling a non-volatile memory device shown in FIG. 1, according to an exemplary embodiment of the present inventive concept;

DETAILED DESCRIPTION OF THE EXEMPLARY EMBODIMENTS

Figure 1:
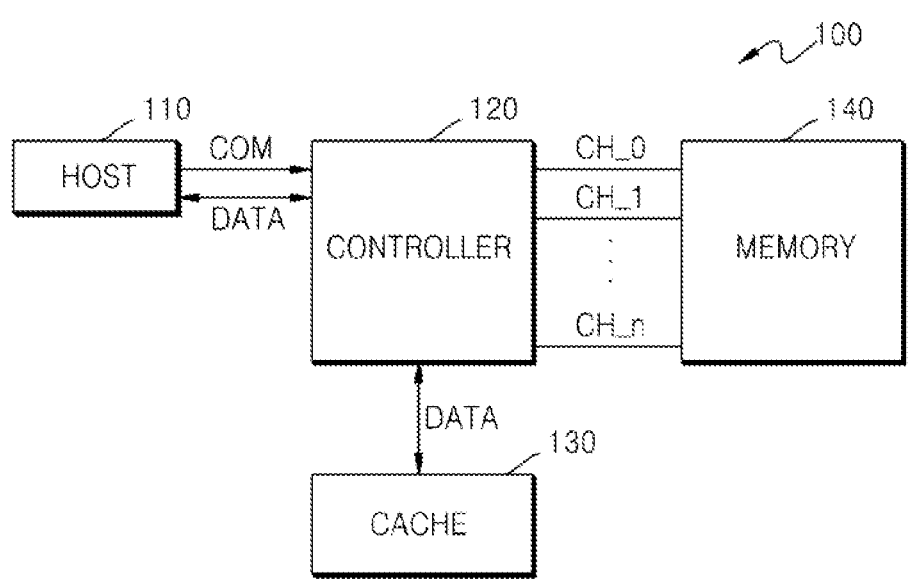
FIG. 1 is a block diagram of a system according to an exemplary embodiment of the present inventive concept.

The attached drawings illustrate exemplary embodiments of the present inventive concept.

Hereinafter, exemplary embodiments of the present inventive concept will be described in detail with reference to the attached drawings. Like reference numerals in the drawings may denote like elements.

FIG. 1 is a block diagram of a system 100 according to an exemplary embodiment of the present inventive concept.

Referring to FIG. 1, the system 100 includes a host 110, a controller 120, a cache memory device 130, and a non-volatile memory device 140.

The host 110 may generate a predetermined command COM, for example, a programming command, a reading command, or an erasing command. The cache memory device 130 may temporarily store data DATA to be programmed before the data DATA is stored in the non-volatile memory 140, or may temporarily store the data DATA read from the non-volatile memory device 140. For example, the cache memory device 130 may be a dynamic random access memory (DRAM). However, the present inventive concept is not limited thereto. The non-volatile memory device 140 may store data. The non-volatile memory device 140 may transmit/receive data to/from the controller 120 through a channel among n channels labelled CH_0, CH_1, . . . , CH_n. The non-volatile memory device 140 may be, for example, a flash memory device.

The controller 120 may perform operations according to the command COM transmitted from the host 110. For example, when the controller 120 receives the programming command from the host 110, the controller 120 may perform controlling operations so that the cache memory device 130 temporarily stores the data DATA to be programmed and the non-volatile memory device 140 may store the data DATA later. If the host 110 transmits the reading command, the controller 120 may perform controlling operations so that the data DATA is read from the non-volatile memory device 140 and temporarily stored in the cache memory 130, and then, is transmitted to the host 110. Operations of the controller 120 will be described in more detail later with reference to FIGS. 5 through 10.

Figure 2:
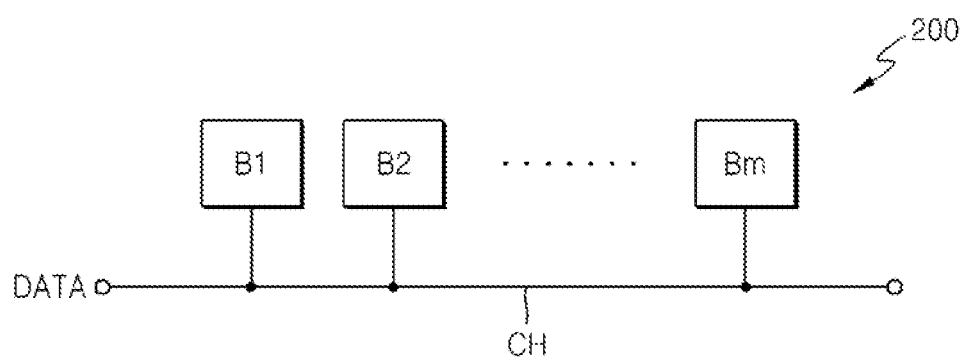
FIG. 2 is a diagram of a second memory device shown in FIG. 1, according to an exemplary embodiment of the present inventive concept.

FIG. 2 is a diagram of a second memory device 200, similar in function to the non-volatile memory device 140 shown in FIG. 1, according to an exemplary embodiment of the present inventive concept.

FIG. 2 shows one channel CH in the non-volatile memory device 140 of FIG. 1, for the convenience of description. For example, when the non-volatile memory device 140 is connected to n channels CH_0, CH_1, . . . , CH_n (wherein n is a natural number) as shown in FIG. 1, the non-volatile memory device 140 may include n structures of FIG. 2.

Referring to FIGS. 1 and 2, the non-volatile memory device 140 may include first through m-th banks B1, B2, . . . , Bm (wherein m is a positive integer). Each of the first through m-th banks B1, B2, . . . , Bm includes a plurality of memory cells for storing data, and the first through m-th banks B1, B2, . . . , Bm are connected to each other via the channel CH. Each of the memory cells may be capable of storing multi-bit data. If the command COM transmitted from the host 110 is the programming command, the controller 120 controls operations of the flash memory device so that the data DATA is programmed in a corresponding memory cell in one of the first through m-th banks B1, B2, . . . , Bm. If the command COM transmitted from the host 110 is the reading command, the controller 120 controls operations of the flash memory device 140 so that the data DATA is read from a corresponding memory cell in one of the first through m-th banks B1, B2, . . . , Bm. If the command COM transmitted from the host 110 is the erasing command, the controller 120 may control operations of the flash memory device 140 so that the corresponding memory cell in one of the first through m-th banks B1, B2, . . . , Bm may be erased.

Figure 3:
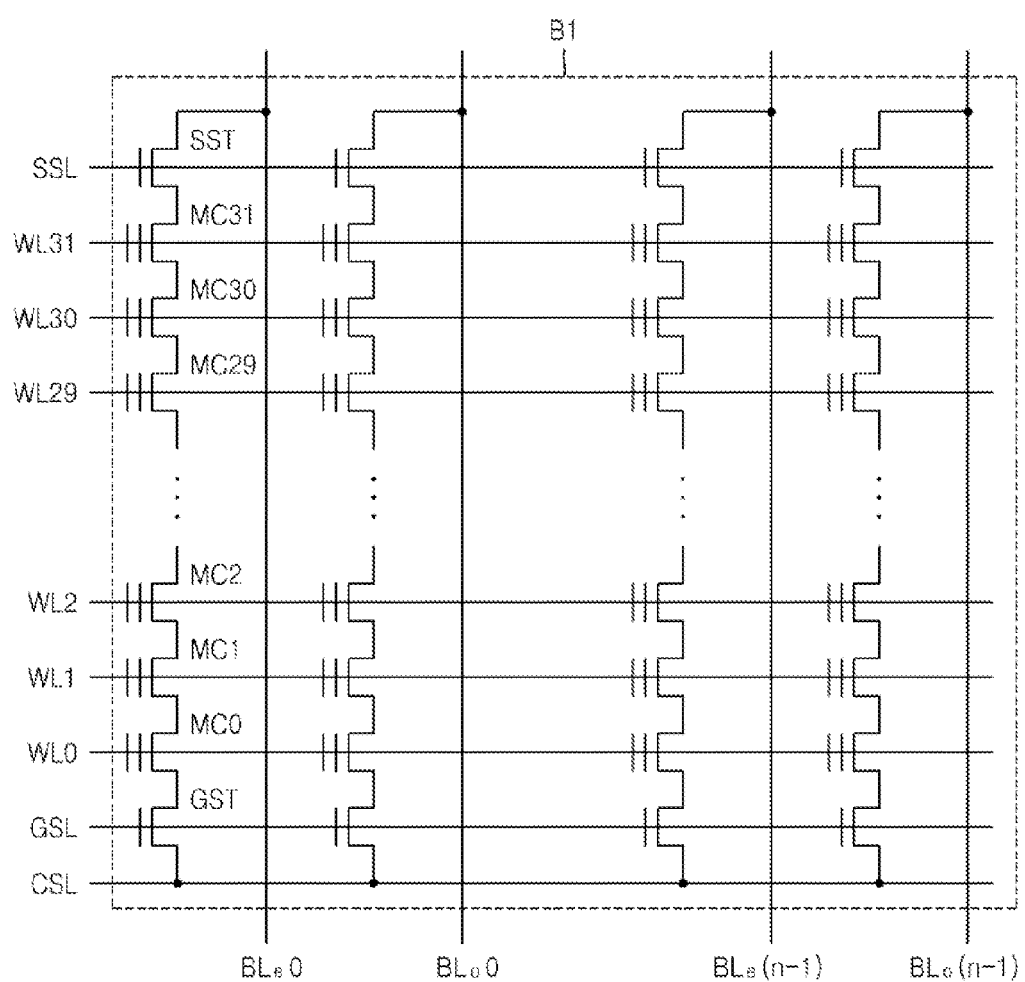
FIG. 3 is a circuit diagram of a first bank shown in FIG. 2, according to an exemplary embodiment of the present inventive concept.

FIG. 3 is a circuit diagram of the first bank B1 shown in FIG. 2, according to an exemplary embodiment of the present inventive concept.

FIG. 3 shows the first bank B1 of FIG. 2, for the convenience of description. However, second through m-th banks B2, . . . , Bm may each have the same structure as the first bank B1 shown in FIG. 3.

Referring to FIGS. 1 through 3, the first bank B1 includes a plurality of strings. Each of the strings may include a string selection transistor SST, a ground selection transistor GST, and memory cells MC31, MC30, . . . , MC0. The string selection transistor SST has a gate connected to a string selection line SSL and a first terminal connected to a corresponding bit line. The ground selection transistor GST has a gate connected to a ground selection line GSL and a first terminal connected to a common source line CSL. The memory cells MC31, MC30, . . . , MC0 are each connected between a second terminal of the string selection transistor SST and a second terminal of the ground selection transistor GST. Corresponding word lines WL31, WL30, . . . , WL0 are connected to gates of the memory cells MC31, MC30, . . . , MC0. A plurality of bit line pairs $(BL_e0, BL_o0)$, $(BL_e1, BL_o1)$, . . . , $(BL_e(n-1), BL_o(n-1))$ may be arranged to cross the word lines WL31, WL30, . . . , WL0. In reading/programming operations, one bit line in each of the bit line pairs $(BL_e0, BL_o0)$, $(BL_e1, BL_o1)$, . . . , $(BL_e(n-1), BL_o(n-1))$ may be selected. A word line may therefore consist of two pages. However, a word line may alternatively consist of one page.

The programming operation for storing 2-bit data may be classified as an operation of programming a least significant bit (LSB) page and an operation of programming a most significant bit (MSB) page. Hereinafter, the operations of programming the LSB and the MSB will be described with reference to FIGS. 4A and 4B.

Figure 4A:
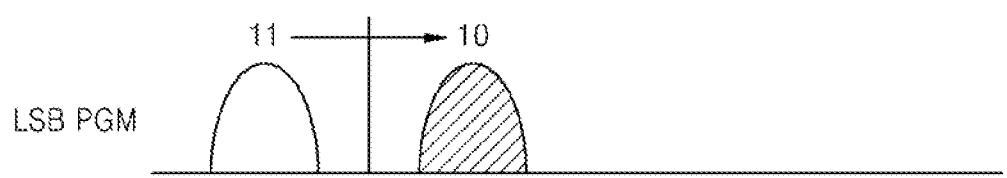
FIG. 4A is a diagram illustrating an operation of programming a least significant bit (LSB) page.
Figure 4B:
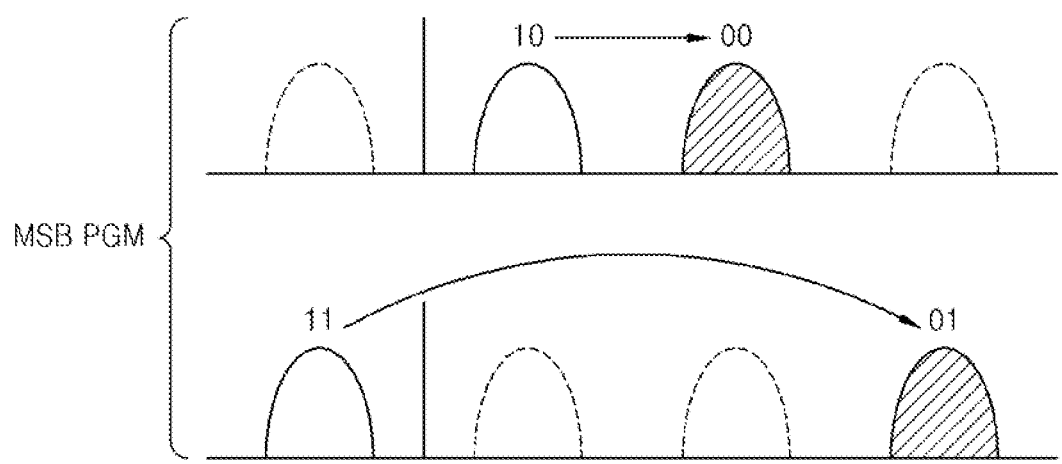
FIG. 4B is a diagram illustrating an operation of programming a most significant bit (MSB) page according to an exemplary embodiment of the present inventive concept.

FIG. 4A is a diagram illustrating the operation of programming the LSB page, and FIG. 4B is a diagram illustrating the operation of programming the MSB page according to an exemplary embodiment of the present inventive concept.

A memory cell may be programmed to have one of the following states "11", "10", "00", and "01". Hereinafter, it is assumed that the memory cell of the "11" state is an erased cell, a threshold voltage of the memory cell having the "10" state is greater than that of the memory cell having the "11" state, a threshold voltage of the memory cell having the "00" state is greater than that of the memory cell having the "10" state, and a threshold voltage of the memory cell having the "01" state is greater than that of the memory cell having the "00" state.

Under the above-described circumstances, when the LSB page is programmed with respect to a memory cell that is already programmed to the "11" state, the memory cell is changed to the erased state or the "10" state as shown in FIG. 4A. If the MSB page is programmed with respect to the memory cell of the "10" state, the memory cell is changed to the "10" state or the "00" state as shown in FIG. 4B. In addition, when the MSB page is programmed with respect to the memory cell of the "11" state, the memory cell is changed to the erased state or the "01" state as shown in FIG. 4B.

Programming of a predetermined bank may include an erasing operation of the bank, as well as the programming operation of the bank. Accordingly, an example of a programming operation including an erasing operation is described hereinafter.

Figure 5:
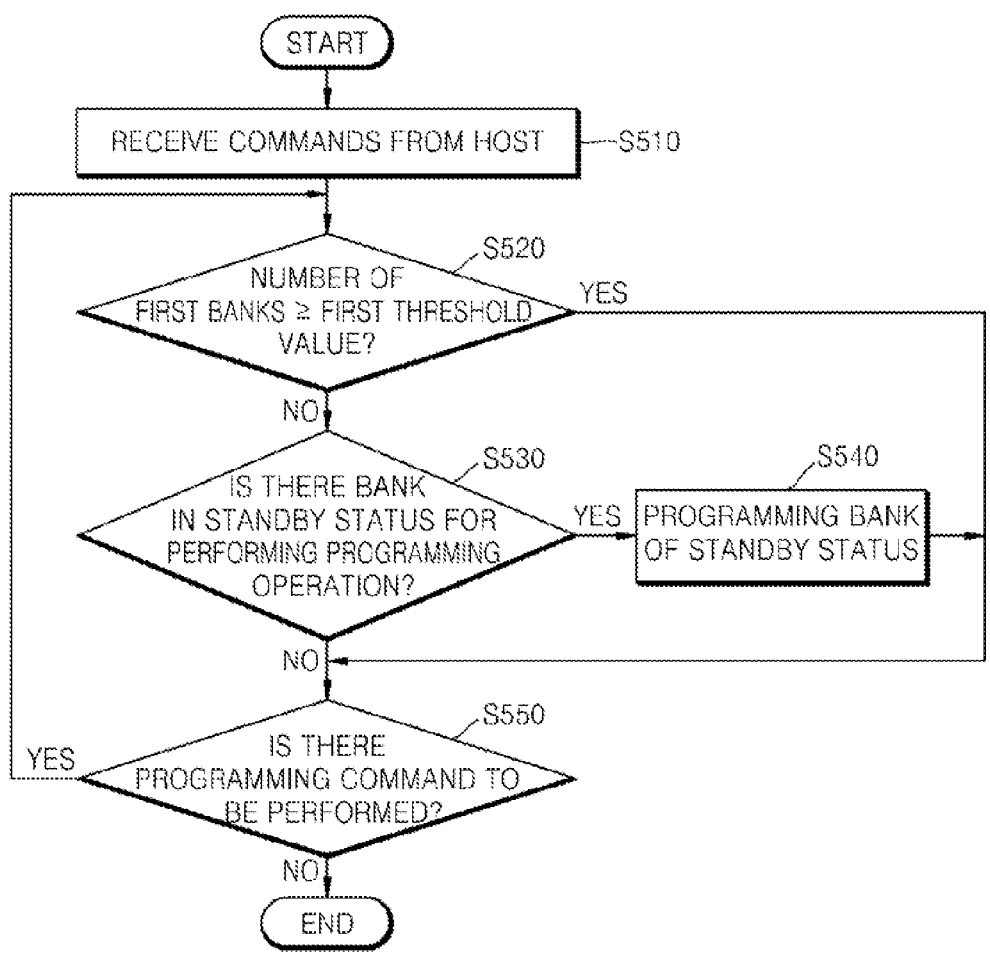
FIG. 5 is a flowchart illustrating a method of controlling a non-volatile memory device shown in FIG. 1, according to an exemplary embodiment of the present inventive concept.

FIG. 5 is a flowchart illustrating a method of controlling the non-volatile memory device 140 shown in FIG. 1, according to an exemplary embodiment of the present inventive concept.

Referring to FIGS. 1 through 5, the controller 120 receives the command COM from the host 110 (S510). The controller 120 controls a predetermined operation according to the command COM transmitted from the host 110. A next command COM may be transmitted before the operation control when the command COM is transmitted. The controller 120 may accordingly process a plurality of commands COM in an order of transmission.

The controller 120 may compare the number of first banks in operating states among the banks which are greater or equal to a first threshold value (S520). The operating states may indicate whether a predetermined operation has been performed in the bank, for example, the state of programming predetermined data in the bank, the state of reading the data from the bank, or the state of erasing the bank. For example, the first bank may be the bank in which the predetermined data is being programmed, the data is being read, or the erasing operation is being performed. Accordingly, the first bank may be the bank in the operating state. The first threshold value may be determined according to the maximum power level consumed by the non-volatile memory device 140. For example, when first through m-th banks B1, B2, . . . , Bm are connected to one channel CH as shown in FIG. 2, the first threshold value may have a value between 1 and m.

As a result of comparing in operation S520, when the number of first banks is smaller than the first threshold value (No, S520), the controller 120 may search for a bank that is in a standby state to perform the programming operation (S530). For example, the controller 120 may detect whether there is a bank in the standby state, which corresponds to the programming command among the commands COM transmitted from the host 110. The standby state may be the state where a predetermined operation is not performed in the bank. If the bank that is in the standby state for performing the programming operation is detected as a result of operation S530 (Yes, S530), the controller 120 may control the bank so that the predetermined data may be programmed in the detected bank in response to the programming command for programming the predetermined data in the bank in the standby state (S540).

Otherwise, if the number of the first banks is equal to or greater than the first threshold value as a result of the comparing in operation S520 (Yes, S520), if there is no bank that is in the standby state for performing the programming operation as a result of determination in operation S530 (No, S530), or if operation S540 is performed, the controller 120 may determine whether there is a command to be performed among the commands COM transmitted from the host 110 (S550). If there is a command to be performed as a result of determination in operation S550 (Yes, S550), then the controller 120 may repeat the operations again from operation S520.

Figure 6:
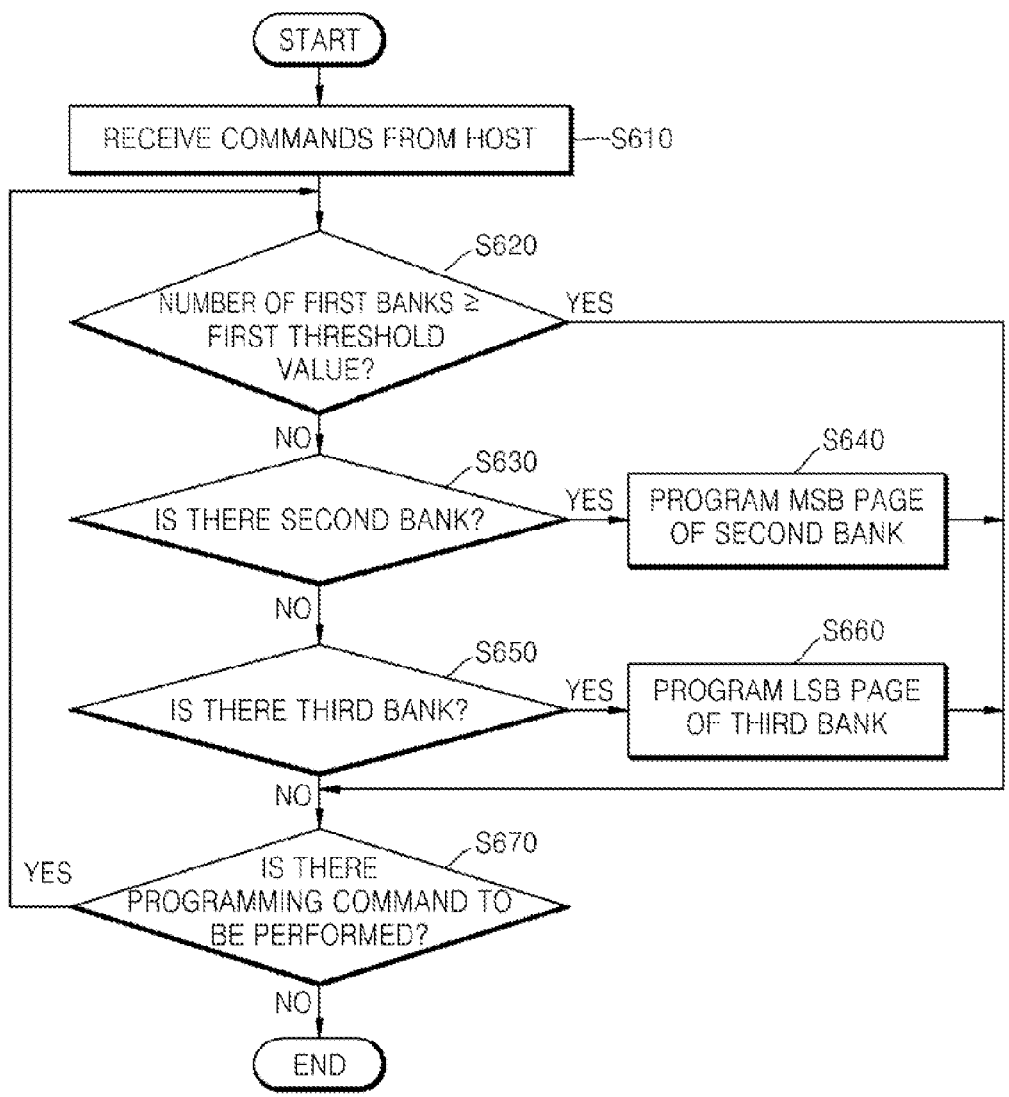
FIG. 6 is a flowchart illustrating a method of controlling a non-volatile memory device shown in FIG. 1, according to an exemplary embodiment of the present inventive concept.

FIG. 6 is a flowchart illustrating a method of controlling the non-volatile memory device 140 of FIG. 1, according to an exemplary embodiment of the present inventive concept.

Referring to FIGS. 1 through 6, the controller 120 receives the commands COM from the host 110 (S610). As described above with reference to FIG. 5, the controller 120 may receive a plurality of commands COM and the controller 120 may process the plurality of commands COM in the order of transmission.

The controller 120 may compare the number of first banks in operating states among the first through mth banks B1, B2, . . . , Bm with a first threshold value (S620). The first banks may be the banks in operating states, for example, the bank in which predetermined data is programmed, the predetermined data is read, or the erasing operation is performed. Operation S620 may be similar to operation S520 of FIG. 5, described above.

If the number of the first banks is smaller than the first threshold value as a result of determination in operation S620 (No, SS620), then the controller 120 searches for a second bank (S630). The second bank may be a bank in a standby state for programming the MSB page. For example, the controller 120 may detect whether there is a bank in the standby state corresponding to the programming command for performing the programming of the MSB page. The standby state may indicate that the predetermined operation is not performed in the bank and may accordingly describe all states except for the operating state.

If the bank that is in the standby state for performing the programming of the MSB page is detected as a result of detection in operation S630 (Yes S630), the controller 120 controls the MSB page of the detected bank to be programmed in response to the programming command for programming the MSB bank of the detected bank in the standby state (S640).

Otherwise, if the second bank is not detected as a result of determination in operation S630 (No, S630), the controller 120 detects whether there is a third bank (S650). The third bank may be a bank that is in the standby state for programming the LSB page. For example, the controller 120 may detect whether there is a bank in the standby state in correspondence with the programming command for programming the LSB page among the commands COM transmitted from the host 110. The standby state may indicate that the predetermined operation is not performed in the bank, and may accordingly describe all states except for the operating state.

If the third bank that is in the standby state for programming the LSB page is detected as a result of detection in operation S650 (Yes, S650), the controller 120 may control the LSB page of the detected bank to be programmed in response to the programming command for programming the LSB page of the bank in the standby state (S660).

Otherwise, if the number of the first banks is equal to or greater than the first threshold value as a result of the determination in operation S620 (Yes, S620), or if the bank that is in the standby state for programming the LSB page is not detected as a result of the detection in operation S650 (No S650), then the controller 120 may determine whether there is a command to be performed among the commands COM transmitted from the host 110 (S670). Additionally, after operation S640 is performed, or after operation S660 is performed, the controller 120 may determine whether there is a command to be performed among the commands COM transmitted from the host 110 (S670). If there is a command to be performed as a result of the determination in operation S670 (Yes, S670), then the controller 120 may repeat the above-described operations from operation S620.

FIG. 7 is a flowchart illustrating a method of controlling the non-volatile memory device 140 of FIG. 1, according to an exemplary embodiment of the present inventive concept.

Referring to FIGS. 1 through 7, the controller 120 receives commands COM from the host 110 (S710). As described above with reference to FIG. 5, the commands COM may be transmitted to the controller 120, and the controller 120 may process the commands COM in the order of transmission.

The controller 120 compares the number of first banks in the operating states among the banks with the first threshold value (S720). The first banks are the banks in the operating states, for example, the banks in which predetermined data is programmed, the predetermined data is read, or the erasing operation is performed. Operation S720 may be similar to operation S520 of FIG. 5 described above.

If the number of the first banks is smaller than the first threshold value as a result of determination in operation S720 (No, S720), the controller 120 detects whether there is a second bank (S730). The second bank may be a bank that is in the standby state for programming the LSB page. For example, the controller 120 may detect whether there is a bank in the standby state corresponding to the programming command for performing the LSB page programming among the commands COM transmitted from the host 110. The standby state may indicate that the predetermined operation is not performed in the bank, and may accordingly describe all states except for the operating state.

If the bank that is in the standby state for performing the programming of the LSB page is detected as a result of detection in operation S730 (Yes, S730), then the controller 120 controls the LSB page of the detected bank to be programmed in response to the programming command for programming the LSB bank of the detected bank in the standby state (S740).

Otherwise, if the second bank is not detected as a result of determination in operation S730 (No, S730), the controller 120 detects whether there is a third bank (S750). The third bank may be a bank that is in the standby state for programming the MSB page. For example, the controller 120 may detect whether there is a bank in the standby state in correspondence with the programming command for programming the MSB page among the commands COM transmitted from the host 110. The standby state may indicate that the predetermined operation is not performed in the bank, and may accordingly describe all states except for the operating state.

If the third bank that is in the standby state for programming the MSB page is detected as a result of detection in operation S750 (Yes, S750), then the controller 120 may control the MSB page of the detected bank to be programmed in response to the programming command for programming the MSB page of the bank in the standby state (S760).

Otherwise, if the number of the first banks is equal to or greater than the first threshold value as a result of the determination in operation S720 (Yes, S720), if the bank that is in the standby state for programming the MSB page is not detected as a result of the detection in operation S750 (No, S750), then the controller 120 may determine whether there is a command to be performed among the commands COM transmitted from the host 110 (S770). Additionally, when operation S740 is performed, or when operation S760 is performed, the controller 120 may determine whether there is a command to be performed among the commands COM transmitted from the host 110 (S770). If there is a command to be performed as a result of the determination in operation S770 (Yes, S770), the controller 120 may repeat the above-described operations from operation S720.

Figures 8A, 8B:
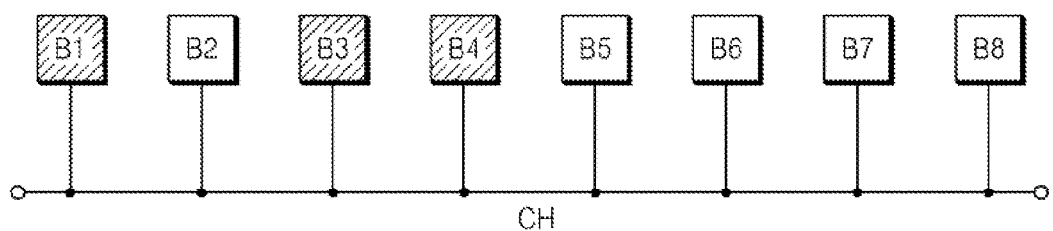
FIG. 8A is a diagram of the non-volatile memory device of FIG. 1, according to an exemplary embodiment of the present inventive concept.
FIG. 8B is a table showing commands transmitted from a host of FIG. 1, according to an exemplary embodiment of the present inventive concept.

FIG. 8A is a diagram of the non-volatile memory device 140 of FIG. 1, according to an exemplary embodiment of the present inventive concept, and FIG. 8B is a table showing the commands COM transmitted from the host 110 of FIG. 1, according to an exemplary embodiment of the present inventive concept. In FIG. 8A, the banks shaded with lines are the banks in the operating states. Accordingly, hereinafter, it is assumed that the banks B1, B3, and B4 are in the operating states. In addition, it is assumed that the first threshold value is 5.

Hereinafter, operations of the non-volatile memory device 140 will be described with reference to FIGS. 1 through 5, and FIGS. 8A and 8B.

The controller 120 receives the commands COM shown in FIG. 8B from the host 110. In operation S520, since the number of the first banks B1, B3, and B4 in the operating states is smaller than the first threshold value, the controller 120 performs operation S530. In operation S530, the controller 120 searches for the bank that is in the standby state for performing the programming operation. In FIG. 8B, the bank B3 that is related to the command LPG_B3 for programming the LSB page of the bank B3 is in the operating state, and the bank B2 relating to the command MPG_B2 for programming the MSB page of the bank B2 is in the standby state, and thus, the bank B2 is detected in operation S530. In addition, in operation S540, the controller 120 controls the MSB page of the bank B2 detected in operation S530 to be programmed.

After operation S540, there are some commands (LPG_B3, LPG_B8, and MPG_B4) to be performed in operation S550, and thus, the controller 120 performs the operations again from operation S520. In operation S540, the number of first banks B1, B2, B3, and B4 in the operating states is four. In operation S520, since the number of the first banks B1, B2, B3, and B4 in the operating states is smaller than the first threshold value, the controller 120 performs operation S530. In operation S530, the controller 120 searches for the bank that is in the standby state for performing the programming operation. In FIG. 8B, the bank B3 relating to the command (LPG_B3) for programming the LSB page of the bank B3 and the bank B2 relating to the command (MPG_B2) for programming the MSB page of the bank B2 are in the operating states, and the bank B8 relating to the command (LPG_B8) for programming the LSB page of the bank B8 is in the standby state, and thus, the bank B8 is detected in operation S530. In addition, in operation S540, the controller 120 controls the LSB page of the bank B8 detected in operation S530 to be programmed.

In operation S550, after performing operation S540, there are the commands (LPG_B3, and MPG_B4) to be performed, and thus, the controller 120 performs the operations again from operation S520. Since operations S540 is performed, the number of first banks B1, B2, B3, B4, and B8 in the operating states is 5. In operation S520, since the number of the first banks B1, B2, B3, B4, and B8 is equal to or greater than the first threshold value, the controller 120 performs operation S550. The controller 120 does not perform the received commands COM until at least a first bank among the first banks B1, B2, B3, B4, and B8 that are currently in the operating states changes to the standby state after finishing the operation.

Hereinafter, operations of the non-volatile memory device 140 will be described with reference to FIGS. 1 through 4, 6, 8A, and 8B.

The controller 120 receives the commands COM shown in FIG. 8B from the host 110. In operation S620, since the number of the first banks B1, B3, and B4 in the operating states is smaller than the first threshold value, the controller 120 performs operation S630. In operation S630, the controller 120 searches for the second bank that is in the standby state for programming the MSB page. The bank B2 relating to the command MPG_B2 for programming the MSB page of the bank B2 is in the standby state, and thus, the second banks B2 is detected in operation S630. In addition, in operation S640, the controller 120 controls the MSB page of the second bank B2 that is detected in operation S630 to be programmed.

There are commands (LPG_B3, LPG_B8, and MPG_B4) to be performed when operation S670 is performed after operation S640, and thus, the controller 120 performs the operations again from operation S620. Since operation S640 is performed, the number of the first banks B1, B2, B3, and B4 in the operating states is four. In operation S620, the number of the first banks B1, B2, B3, and B4 in the operating states is smaller than the first threshold value, and thus, the controller 120 performs operation S630. In operation S630, the controller 120 searches for the second bank that is in the standby state for programming the MSB page. Since the bank B4 relating to the command MPG_B4 for programming the MSB page of the bank B4 shown in FIG. 8B is in the operating state, the controller 120 does not search for the second bank in operation 5630. Therefore, the controller 120 performs operation S650. In operation S650, the controller 120 searches for a third bank that is in the standby state for programming the LSB page. Since the bank B3 relating to the command LPG_B3 for programming the LSB page of the bank B3 shown in FIG. 8B is in the operating state and the bank B8 relating to the command LPG_B8 for programming the MSB page of the bank B8 is in the standby state, the bank B8 is searched for as the third bank in operation S650. In addition, in operation S660, the controller 120 controls the LSB page of the third bank B8 detected in operation S650 to be programmed.

When operation S670 is performed after operation S660, there are commands (LPG_B3, and MPG_B4) to be performed, and thus, the controller 120 performs the operations again from operation S620. Since operation S660 is performed, the number of first banks B1, B2, B3, B4, and B8 in the operating states is five. In operation S620, the number of the first banks in the operating states is equal to or greater than the first threshold value, and thus, the controller 120 performs operation S670. The controller 120 does not perform the received commands COM until at least a first bank among the first banks B1, B2, B3, B4, and B8 that are currently in the operating states finishes the operation and changes into the standby state.

Hereinafter, operations of the non-volatile memory device 140 will be described with reference to FIGS. 1 through 4, and 7 through 8B.

The controller 120 receives the commands COM shown in FIG. 8B from the host 110. In operation S720, since the number of the first banks B1, B3, and B4 in the operating states is smaller than the first threshold value, the controller 120 performs operation S730. In operation S730, the controller 120 searches for the second bank that is in the standby state for programming the LSB page. The bank B3 relating to the command LPG_B3 for programming the LSB page of the bank B3 is in the operating state and the bank B8 relating to the command LPG_B8 for programming the LSB page of the bank B8 is in the standby state, and thus, the second bank B8 is detected in operation S730. In addition, in operation S740, the controller 120 controls the LSB page of the second bank B8 that is detected in operation S730 to be programmed.

There are commands (LPG_B3, MPG_B8, and MPG_B4) to be performed when operation S770 is performed after operation S740, and thus, the controller 120 performs the operations again from operation S720. Since operation S740 is performed, the number of the first banks B1, B2, B3, and B8 in the operating states is four. In operation S720, the number of the first banks B1, B2, B3, and B8 in the operating states is smaller than the first threshold value, the controller 120 performs operation S730. In operation S730, the controller 120 searches for the second bank that is in the standby state for programming the LSB page. Since the bank B3 relating to the command LPG_B3 for programming the LSB page of the bank B3 shown in FIG. 8B is in the operating state, the controller 120 does not search for the second bank in operation S730. Therefore, the controller 120 performs operation S750. In operation S750, the controller 120 searches for a third bank that is in the standby state for programming the MSB page. Since the bank B2 relating to the command MPG_B2 for programming the MSB page of the bank B2 shown in FIG. 8B is in the standby state, the bank B2 is found as the third bank in operation S750. In addition, in operation S760, the controller 120 controls the MSB page of the third bank B2 detected in operation S750 to be programmed.

When operation S770 is performed after operation S760, there are commands (LPG_B3, and MPG_B4) to be performed, and thus, the controller 120 performs the operations again from operation S720. Since operation S760 is performed, the number of first banks B1, B2, B3, B4, and B8 in the operating states is five. In operation S720, the number of the first banks in the operating states is equal to or greater than the first threshold value, and thus, the controller 120 performs operation S770. The controller 120 does not perform the received commands COM until at least a first bank among the first banks B1, B2, B3, B4, and B8 that are currently in the operating states finishes the operation and changes into the standby state.

The programming operations of the non-volatile memory device 140 are described as above. Hereinafter, the reading operation of the non-volatile memory device 140 will be described with reference to FIGS. 9 through 10B.

Figure 9:
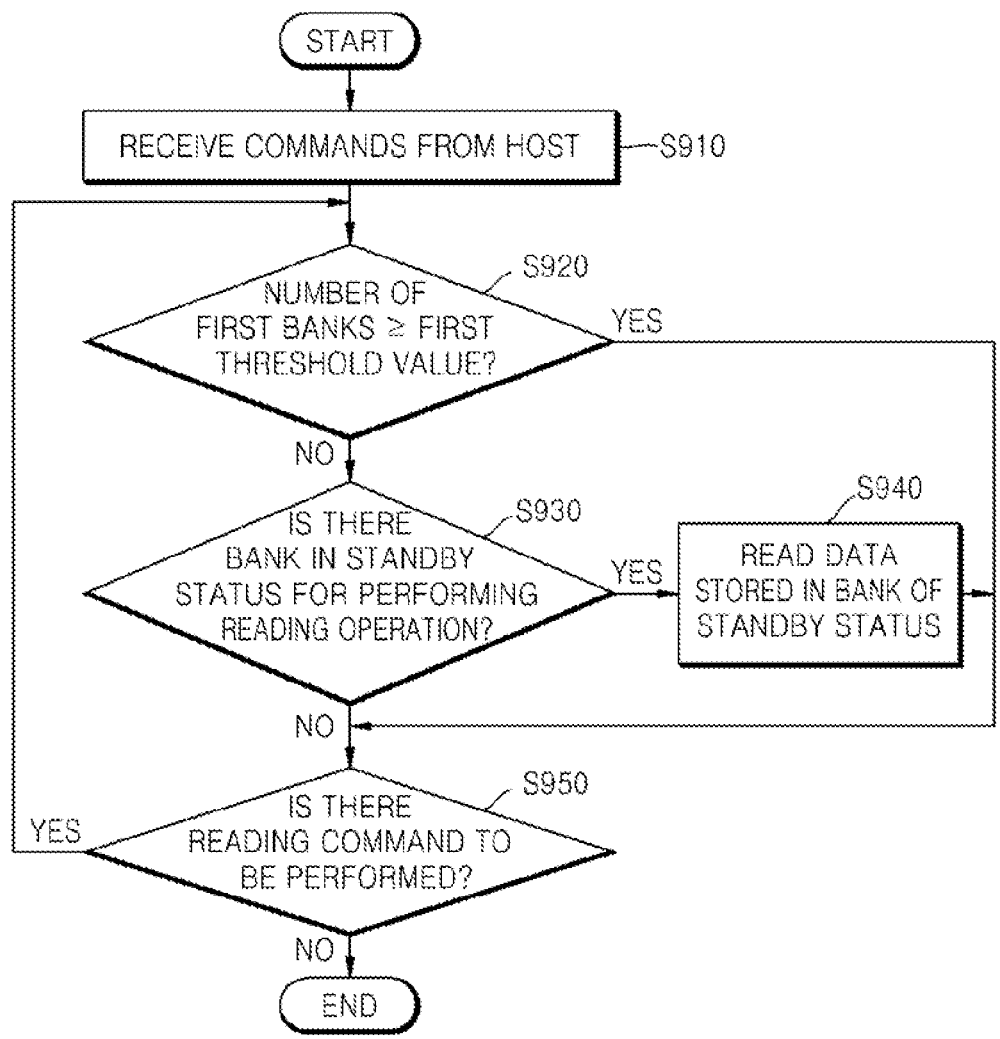
FIG. 9 is a flowchart illustrating a method of controlling a non-volatile memory device shown in FIG. 1, according to an exemplary embodiment of the present inventive concept.

FIG. 9 is a flowchart illustrating a method of controlling the non-volatile memory device 140 of FIG. 1, according to an exemplary embodiment of the present inventive concept.

Referring to FIGS. 1 through 4, and 9, the controller 120 receives commands COM from the host 110 (S910). As described with reference to FIG. 5, the controller 120 may receive a plurality of commands COM, and the controller 120 may process the plurality of commands COM in the order of transmission.

The controller 120 may compare the number of first banks in the operating states with the first threshold value (S920). Operation S920 may be similar to operation S520 discussed above with reference to FIG. 5.

If the number of first banks is smaller than the first threshold value as a result of determination in operation S920 (No, S920), then the controller 120 may search for a bank that is in the standby state for performing the reading operation (S930). For example, the controller 120 may detect whether there is a bank in the standby state that corresponds to the reading operation among the commands COM transmitted from the host 110. The standby state may indicate that a certain operation is not performed in the bank. If the bank that is in the standby state for performing the reading operation is detected as a result of the detection in operation S930 (Yes, S930), the controller 120 controls the data stored in the detected bank to be read in response to the reading command for reading the data stored in the bank in the standby state (S940).

Otherwise, if the number of the first banks is equal to or greater than the first threshold value as a result of determination in operation S920 (Yes, 920), or if the bank in the standby state is not detected as a result of the detection in operation S930 (No S930), then the controller 120 may determine whether there is a command to be performed among the commands COM transmitted from the host 110 (S950). Additionally, if operation S940 is performed, the controller 120 may determine whether there is a command to be performed among the commands COM transmitted from the host 110 (S950). If there is a command to be performed as a result of determination in operation S950 (Yes, S950), the controller 120 may perform the operations again from operation S920.

Figures 10A, 10B:
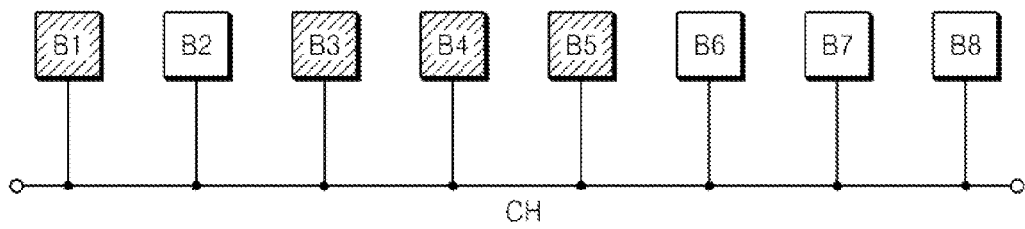
FIG. 10A is a diagram of the non-volatile memory device of FIG. 1, according to an exemplary embodiment of the present inventive concept.
FIG. 10B is a table showing commands transmitted from the host of FIG. 1, according to an exemplary embodiment of the present inventive concept.

FIG. 10A is a diagram of the non-volatile memory device 140 shown in FIG. 1, according to an exemplary embodiment of the present inventive concept, and FIG. 10B is a table showing the commands COM transmitted from the host 110 of FIG. 1. In FIG. 10A, the banks shaded with lines are the banks in the operating states. Hereinafter, it is assumed that the banks B1, B3, B4, and B5 are in the operating states. In addition, it is assumed that the first threshold value is 5.

Hereinafter, operations of the non-volatile memory device 140 will be described with reference to FIGS. 1 through 4, and 9 through 10B.

The controller 120 receives the commands COM shown in FIG. 10B from the host 110. In operation S920, since the number of the first banks B1, B3, B4, and B5 in the operating states is smaller than the first threshold value, the controller 120 performs operation S930. In operation S930, the controller 120 searches for the bank that is in the standby state for performing the reading operation. In FIG. 10B, the bank B5 relating to the command RD_B5 for reading data stored in the bank B5 is in the operating state, and the bank B6 relating to the command RD_B6 for reading data stored in the bank B6 is in the standby state, and thus, the bank B6 is detected in operation S930. In addition, in operation S940, the controller 120 controls the data stored in the bank B6 detected in operation S930 to be read.

In operation S950, after performing operation S940, there is a command (RD_B5) to be performed, and thus, the controller 120 performs the operations again from operation S920. Since operation S940 is performed, the number of first banks B1, B3, B4, B5, and B6 in the operating states is 5. In operation S920, since the number of the first banks B1, B3, B4, B5, and B6 is equal to or greater than the first threshold value, the controller 120 performs operation S950. The controller 120 does not perform the received commands COM until at least a first bank among the first banks B1, B3, B4, B5, and B6 that are currently in the operating states changes into the standby state after finishing the operation.

Figure 11:
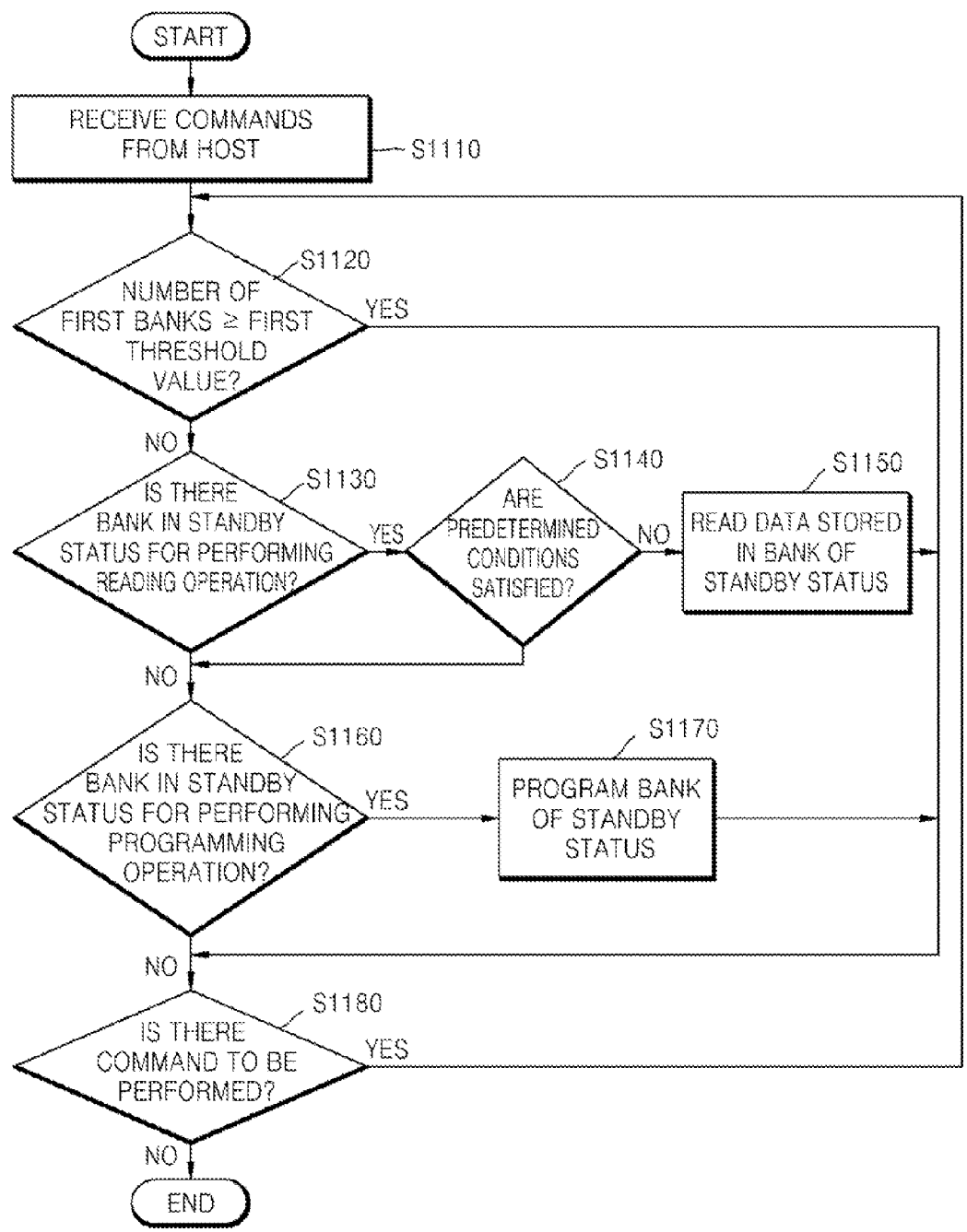
FIG. 11 is a flowchart illustrating a method of controlling the non-volatile memory device shown in FIG. 1, according to an exemplary embodiment of the present inventive concept.

FIG. 11 is a flowchart illustrating a method of controlling the non-volatile memory device 140 of FIG. 1, according to an exemplary embodiment of the present inventive concept.

Hereinafter, the reading operation or the programming operation of the non-volatile memory device 140 of FIG. 1 will be described with reference to FIGS. 1 through 11.

The controller 120 receives commands COM from the host 110 (S1110). As described with reference to FIG. 5, the controller 120 may receive a plurality of commands COM, and the controller 120 may process the plurality of commands COM in the order of transmission.

The controller 120 may compare the number of first banks in the operating states with the first threshold value (S1120). The first bank may be the bank in the operating state, such as the bank in which predetermined data is programmed, predetermined data is read, or the erasing operation is performed. Operation S1120 may be similar to operation S520 discussed above with respect to FIG. 5.

If the number of first banks is smaller than the first threshold value as a result of determination in operation S1120 (No, S1120), then the controller 120 may search for a bank that is in the standby state for performing the reading operation (S1130). For example, the controller 120 may detect whether there is a bank in the standby state that corresponds to the reading command among the commands COM transmitted from the host 110. The standby state may indicate that a certain operation is not performed in the bank. If the bank that is in the standby state for performing the reading operation is detected as a result of the detection in operation S1130 (Yes, S1130), then the controller 120 controls the data stored in the detected bank to be read in response to the reading command for reading the data stored in the bank in the standby state (S1150). However, operation S1140 may be additionally performed between operation S1130 and operation S1150, and operation S1150 might not be performed when a predetermined condition is satisfied even if the bank that is in the standby state for performing the reading operation is detected in operation S1130. For example, the controller 120 may determine whether operation S1150 is performed by using at least one of the number of times of repeatedly performing operation S1150, the time of performing operation S1150 continuously, and the number of programming commands to be performed. For example, the controller 120 may determine that operation S1150 is not performed when operation S1150 is performed continuously 10 times. However, the conditions of operation S1140 are not limited to the above three cases, and conditions may be added or changed if necessary.

Otherwise, if the bank that is in the standby state for performing the reading operation as a result of detection in operation S1130 or if the above conditions in operation S1140 are satisfied (Yes, S1140), then the controller 120 may search for a bank that is in the standby state for performing the programming operation (S1160). For example, the controller 120 may detect whether there is a bank in the standby state corresponding to the programming command to be performed among the commands COM transmitted from the host 110. The standby state may indicate that a predetermined operation is not performed in the bank. If the bank that is in the standby state for performing the programming operation is detected as a result of operation S1160 (Yes, S1160), then the controller 120 may control the data to be programmed in the detected bank in response to the programming command (S1170).

Otherwise, if the number of the first banks is equal to or greater than the first threshold value as a result of determination in operation S1120 (Yes, S1120), or if the bank that is in the standby state for performing the programming operation is not detected as a result of the detection in operation S1160 (No, S1160), then the controller 120 may determine whether there is a command to be performed among the commands COM transmitted from the host 110 (S1180). Additionally, if operation S1150 is performed, or if operation S1170 is performed, the controller 120 may determine whether there is a command to be performed among the commands COM transmitted from the host 110 (S1180). If there is a command to be performed as a result of determination in operation S1180 (Yes, S1180), the controller 120 may perform the operations again from operation S1120.

Although not shown in FIG. 11, operations S630 and S650 illustrated in FIG. 6 may be performed instead of operations S1160 and S1170. Otherwise, operations S730 and S750 illustrated in FIG. 7 may be performed instead of operations S1160 and S1170 of FIG. 11. Operations S630 and S650 are described in detail above with reference to FIG. 6, and operations S730 and S750 are described in detail above with reference to FIG. 7.

Figures 12A, 12B:
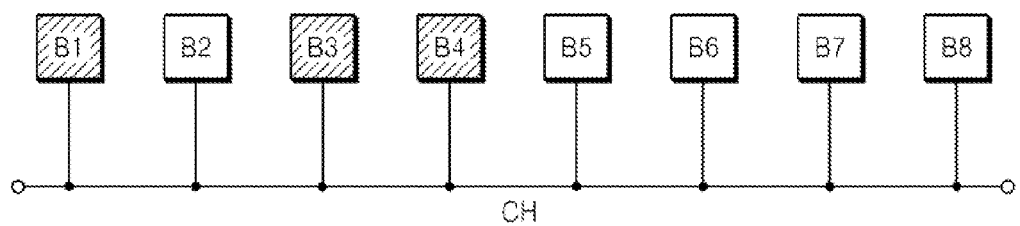
FIG. 12A is a diagram of the non-volatile memory device of FIG. 1, according to an exemplary embodiment of the present inventive concept.
FIG. 12B is a table showing commands transmitted from the host of FIG. 1, according to an exemplary embodiment of the present inventive concept.

FIG. 12A is a diagram showing the non-volatile memory device 140 of FIG. 1, according to an exemplary embodiment of the present inventive concept, and FIG. 12B is a table showing commands COM transmitted from the host 110 of FIG. 1, according to an exemplary embodiment of the present inventive concept. In FIG. 12A, the banks filled with lines are the banks in the operating states. Hereinafter, it is assumed that the banks B1, B3, and B4 are in the operating states. In addition, it is assumed that the first threshold value is 5.

Hereinafter, operations of the non-volatile memory device 140 will be described with reference to FIGS. 1 through 12B.

The controller 120 receives the commands COM shown in FIG. 12B from the host 110. In operation S1120, since the number of the first banks B1, B3, and B4 in the operating states is smaller than the first threshold value, the controller 120 performs operation S1130. In operation S1130, the controller 120 searches for the bank that is in the standby state for performing the reading operation. In FIG. 12B, the bank B3 relating to the command LPG_B3 for programming the LSB page of the bank B5 is in the operating state, and the bank B2 relating to the command MPG_B2 for programming the MSB page of the bank B2 is not the bank that is in the standby state for performing the reading operation. Since the bank B5 relating to the command RD_B5 for reading the data stored in the bank B5 is in the standby state, the bank B5 is detected in operation S1130. When it is assumed that the conditions of operation S1140 are not satisfied, the controller 120 controls the data stored in the bank B5 that is detected in operation S1130 to be read in operation S1150.

In operation S1180, after performing operation S1150, there are commands (LPG_B3, MPG_B2, LPG_B8, MPG_B4, and RD_B6) to be performed, and thus, the controller 120 performs the operations again from operation S1120. Since operation S1150 is performed, the number of first banks B1, B3, B4, and B5 in the operating states is 4. In operation S1120, since the number of the first banks B1, B3, B4, and B5 is smaller than the first threshold value, the controller 120 performs operation S1130. In operation S1130, the controller 120 searches for a bank that is in the standby state for performing the reading operation. In FIG. 12B, since the bank B6 relating to the command RD_B6 for reading the data stored in the bank B6 is in the standby state, the bank B6 is detected in operation S1130.

When it is assumed that the conditions of operation S1140 are satisfied, the controller 120 may perform operation S1160 without performing operation S1150. The controller 120 searches for a bank that is in the standby state for performing the programming operation. In FIG. 12B, the bank B3 relating to the command LPG_B3 for programming the LSB page of the bank B3 is in the operating state and the bank B2 relating to the command MPG_B2 for programming the MSB page of the bank B2 is in the standby state, and thus, the bank B2 is detected in operation S1160. In addition, the controller 120 controls the MSB page of the bank B2 that is detected in operation S1160 to be programmed in operation S1170.

In operation S1180, after performing operation S1170, there are commands (LPG_B3, LPG_B8, MPG_B4, and RD_B6) to be performed, and thus, the controller 120 performs the operations again from operation S1120. Since operations S1150 and S1170 are performed, the number of first banks B1, B2, B3, B4, and B5 in the operating states is 5. In operation S1120, since the number of the first banks B1, B2, B3, B4, and B5 is equal to or greater than the first threshold value, the controller 120 performs operation S1180. The controller 120 does not perform the received commands COM until at least a first bank among the first banks B1, B2, B3, B4, and B5 that are currently in the operating states changes into the standby state after finishing the operation.

Hereinafter, a case where operations S630 and S650 illustrated in FIG. 6 are performed instead of operations S1160 and S1170 of FIG. 11 will be described. Here, it is assumed that the first threshold value is 6.

The performing of a reading operation after searching for the bank B5 may be similar to the manner described above. In addition, it is here assumed that the bank B6 is detected in operation S1130 and the conditions of operation S1140 are satisfied.

In operation S630, the controller 120 searches for a second bank that is in the standby state for programming the MSB page. In FIG. 12B, the bank B2 relating to the command MPG_B2 for programming the MSB page of the bank B2 is in the standby state, the second bank B2 is detected in operation S630. In addition, in operation S640, the controller 120 controls the MSB page of the second bank B2 that is detected in operation S630 to be programmed.

When operation S1180 is performed after operation S640, there are commands (LPG_B3, LPG_B8, MPG_B4, and RD_B6) to be performed, and thus, the controller 120 performs the operations again from operation S1120. The number of first banks B1, B2, B3, B4, and B5 that are currently in the operating states is 5. In operation S1120, since the number of first banks B1, B2, B3, B4, and B5 is smaller than the first threshold value, the controller 120 performs operation S1130. In FIG. 12B, the bank B6 relating to the command RD_B6 for reading the data stored in the bank B6 is in the standby state, and thus, the bank B6 is detected in operation S1130.

However, when it is assumed that the conditions of operation S1140 are satisfied, the controller 120 may perform operation S630 instead of performing operation S1150. The controller 120 searches for a second bank that is in the standby state for programming the MSB page. In FIG. 12B, the bank B4 relating to the command MPG_B4 for programming the MSB page of the bank B4 is in the operating state, and thus, the controller 120 does not search for the second bank in operation S630. Therefore, the controller 120 performs operation S650. In operation S650, the controller 120 searches for a third bank that is in the standby state for programming the LSB page. In FIG. 12B, the bank B3 relating to the command LPG_B3 for programming the LSB page of the bank B3 is in the operating state and the bank B8 relating to the command LPG_B8 for programming the LSB page of the bank B8 is in the standby state, and thus, the bank B8 is detected as the third bank in operation S650. In addition, in operation S660, the controller 120 controls the LSB page of the third bank B8 that is detected in operation S650 to be programmed.

When operation S1180 is performed after operation S660, there are commands (LPG_B3, MPG_B4, and RD_B6) to be performed, and thus, the controller 120 performs the operations again from operation S1120. The number of first banks B1, B2, B3, B4, B5, and B8 that are currently in the operating states is 6. In operation S1120, since the number of first banks B1, B2, B3, B4, B5, and B8 is equal to or greater than the first threshold value, the controller 120 performs operation S1180. The controller 120 does not execute the received commands COM until at least a first bank among the first banks B1, B2, B3, B4, B5, and B8 finishes the operation and changes into the standby state.

Hereinafter, a case where operations S730 and S750 illustrated in FIG. 7 are performed instead of operations S1160 and S1170 illustrated in FIG. 11 will be described. Hereinafter, it is assumed that the first threshold value is 6.

The performing of a reading operation after searching for the bank B5 may be similar to the manner described above. In addition, it is assumed that the bank B6 is detected in operation S1130 and the conditions of operation S1140 are satisfied.

In operation S730, the controller 120 searches for a second bank that is in the standby state for programming the LSB page. In FIG. 12B, the bank B3 relating to the command LPG_B3 for programming the LSB page of the bank B3 is in the operating state and the bank B8 relating to the command LPG_B8 for programming the LSB page of the bank B8 is in the standby state, and thus, the second bank B8 is detected in operation S730. In addition, in operation S740, the controller 120 controls the LSB page of the second bank B8 that is detected in operation S730 to be programmed.

When operation S1180 is performed after operation S740, there are commands (LPG_B3, MPG_B2, MPG_B4, and RD_B6) to be performed, and thus, the controller 120 performs the operations again from operation S1120. The number of first banks B1, B3, B4, B5, and B8 that are currently in the operating states is 5. In operation S1120, since the number of first banks B1, B3, B4, B5, and B8 is smaller than the first threshold value, the controller 120 performs operation S1130. In FIG. 12B, the bank B6 relating to the command RD_B6 for reading the data stored in the bank B6 is in the standby state, and thus, the bank B6 is detected in operation S1130.

However, when it is assumed that the conditions of operation S1140 are satisfied, the controller 120 may perform operation S730 instead of performing operation S1150. The controller 120 searches for a second bank that is in the standby state for programming the LSB page. In FIG. 12B, the bank B3 relating to the command LPG_B3 for programming the LSB page of the bank B3 is in the operating state, and thus, the controller 120 does not search for the second bank in operation S730. Therefore, the controller 120 performs operation S750. In operation S750, the controller 120 searches for a third bank that is in the standby state for programming the MSB page. In FIG. 12B, the bank B2 relating to the command MPG_B2 for programming the MSB page of the bank B2 is in the standby state, and thus, the bank B2 is detected as the third bank in operation S750. In addition, in operation S760, the controller 120 controls the MSB page of the third bank B2 that is detected in operation S750 to be programmed.

When operation S1180 is performed after operation S760, there are commands (LPG_B3, MPG_B4, and RD_B6) to be performed, and thus, the controller 120 performs the operations again from operation S1120. The number of first banks B1, B2, B3, B4, B5, and B8 that are currently in the operating states is 6. In operation S1120, since the number of first banks B1, B2, B3, B4, B5, and B8 is equal to or greater than the first threshold value, the controller 120 performs the operation S1180. The controller 120 does not execute the received commands COM until at least a first bank among the first banks B1, B2, B3, B4, B5, and B8 finishes the operation and changes into the standby state.

While exemplary embodiments of the present inventive concept have been described in detail above, it will be understood that various changes in form and details may be made.

What is claimed is:

1. A method of controlling a non-volatile memory device comprising a plurality of banks, the method comprising:
    comparing a number of first banks of the plurality of banks that are in an operating state with a first threshold value;
    when the number of the first banks that are in the operating state is smaller than the first threshold value, reading data stored in a bank of the plurality of banks that is in a standby state in response to a corresponding reading command among at least one received command;
    when there are no banks, of the plurality of banks, that are to be read, programming a bank in the standby state among the plurality of banks in response to a corresponding programming command among at least one received command;
    when the number of the first banks that are in the operating state is equal to or greater than the first threshold value or when the reading or the programming is performed, determining whether there is a reading command to be performed or a programming command to be performed among the at least one received command; and
    when there is the reading command to be performed or the programming command to be performed, the steps of comparing, programming, and determining are repeated for as long as there is either the reading command to be performed or the programming command to be performed.

2. The method of claim 1, wherein the programming of the bank in the standby state comprises:
    when there is no bank to be read, programming a most significant bit (MSB) page of a second bank that is in the standby state among the plurality of banks in response to the corresponding programming command; and
    when there is no bank to be read, the MSB page of which is to be programmed, programming a least significant bit (LSB) page of a third bank that is in the standby state among the plurality of banks in response to the corresponding programming command.

3. The method of claim 2, wherein the programming of the MSB page comprises:
    when there is no bank to be read, searching for a second bank that is in the standby state for performing the programming operation of the MSB page among the plurality of banks; and
    when the second bank is detected, programming the MSB page of the second bank in response to the corresponding programming command,
    and the programming of the LSB page comprises:
    when the second bank is not found, searching for a third bank that is in the standby state for performing the programming operation of the LSB page among the plurality of banks; and
    when the third bank is detected, programming the LSB page of the third bank in response to the corresponding programming command.

4. The method of claim 1, wherein the programming of the bank in the standby state comprises:
    when there is no bank to be read, programming a LSB page of a second bank that is in the standby state among the plurality of banks in response to the corresponding programming command; and
    when there is no bank to be read, the LSB page is to be programmed, and programming a MSB page of a third bank that is in the standby state among the plurality of banks in response to the corresponding programming command.

5. The method of claim 4, wherein the programming of the LSB page comprises:
    when the number of the first banks is smaller than the first threshold value, searching for the second bank that is in the standby state for performing the programming operation of the LSB page among the plurality of banks; and
    when the second bank is found, programming the LSB page of the second bank in response to the corresponding programming command,
    and the programming of the MSB page comprises:
    when the second bank is not detected, searching for the third bank that is in the standby state for performing the programming operation of the MSB page among the plurality of banks; and
    when the third bank is detected, programming the MSB page of the third banks in response to the corresponding programming command.

6. The method of claim 1, wherein the reading of the data comprises:
    when the number of the first banks is smaller than the first threshold value, searching for a bank that is in the standby state for performing the reading operation among the plurality of banks; and when the bank to be read is detected, reading the data stored in the detected bank in response to the corresponding reading command.

7. The method of claim 6, wherein the reading of the data further comprises, when the bank for performing the reading operation is detected, determining whether the reading of the data stored in the second bank is performed or the programming operation is performed by using predetermined conditions.

8. The method of claim 7, wherein the determining comprises determining whether the reading of the data stored in the second bank is performed or the programming operation is performed by using at least one of the number of times performing the reading operation continuously, time of performing the reading operation continuously, and the number of programming commands to be performed, when the bank for performing the reading operation is detected.

9. The method of claim 1, further comprising:
receiving a programming command or a reading command from a host;
when the programming command is received, storing data to be programmed in a cache memory;
when the reading command is received, determining whether the data to be read is stored in the cache memory; and
when the data to be read is stored in the cache memory, reading the data from the cache memory in response to the reading command.

10. The method of claim 9, wherein the programming comprises programming data stored in the cache memory in a bank that is in the standby state among the plurality of banks in response to the corresponding programming command, when there is no bank to read.

11. The method of claim 1, further comprising, when the number of the first banks is smaller than the first threshold value, erasing a bank in the standby state among the plurality of banks in response to a corresponding erasing command among at least one received command.

12. A method of controlling a non-volatile memory device comprising a plurality of banks, the method comprising:
comparing a number of first banks that are in an operating state with a first threshold value;
when the number of the first banks that are in an operating state is smaller than the first threshold value, programming a bank that is in a standby state, among the plurality of banks, in response to a corresponding programming command among at least one received command;
when the number of the first banks that are in an operating state is equal to or greater than the first threshold value or when the programming is performed, determining whether there is a programming command to be performed among the at least one received command; and
when there is the programming command to be performed, repeating the steps of comparing, programming, and determining until there is no programming command to be performed.

13. The method of claim 12, wherein the programming of the bank that is in the standby state comprises:
when the number of the first banks that are in an operating state is smaller than the first threshold value, programming a most significant bit (MSB) page of a second bank that is in the standby state among the plurality of banks in response to the corresponding programming command; and
when there are no banks in an operating state, the MSB page of which is to be programmed, programming a least significant bit (LSB) page of a third bank that is in the standby state among the plurality of banks in response to the corresponding programming command.

14. The method of claim 13, wherein the programming of the MSB page comprises:
when the number of the first banks that are in an operating state is smaller than the first threshold value, searching for the second bank that is in the standby state for performing the programming operation of the MSB page among the plurality of banks; and
when the second bank is detected, programming the MSB page of the second bank in response to the corresponding programming command,
and the programming of the LSB page comprises:
when the second bank is not detected, searching for the third bank that is in the standby state for performing the programming operation of the LSB page among the plurality of banks; and
when the third bank is detected, programming the LSB page of the third bank in response to the corresponding programming command.

15. The method of claim 12, wherein the programming of the bank that is in the standby state comprises:
when the number of the first banks that are in an operating state is smaller than the first threshold value, programming a LSB page of a second bank that is in the standby state among the plurality of banks in response to the corresponding programming command; and
when there is no bank in an operating state, the LSB page of which is to be programmed, programming a MSB page of a third bank that is in the standby state among the plurality of banks in response to the corresponding programming command.

16. The method of claim 15, wherein the programming of the LSB page comprises:
when the number of the first banks that are in an operating state is smaller than the first threshold value, searching for the second bank that is in the standby state for performing the programming operation of the LSB page among the plurality of banks; and
when the second bank is detected, programming the LSB page of the second bank in response to the corresponding programming command,
and the programming of the MSB page comprises:
when the second bank is not detected, searching for the third bank that is in the standby state for performing the programming operation of the MSB page among the plurality of banks; and
when the third bank is detected, programming the MSB page of the third bank in response to the corresponding programming command.

17. The method of claim 12, further comprising, when the number of the first banks that are in an operating state is smaller than the first threshold value, erasing a bank in the standby state among the plurality of banks in response to a corresponding erasing command among at least one received command.

18. A method for controlling a non-volatile memory device comprising a plurality of banks comprises:
receiving a plurality of commands from a host;
comparing a number of first banks for which a predetermined operation has been performed with a first threshold value;
searching for a bank for which the predetermined operation has not been performed to perform a programming operation upon when the number of first banks for which a predetermined operation has been performed is smaller than the first threshold value; and programming the bank for which the predetermined operation has not been performed when a bank has been found as a result of the search, wherein when the number of first banks for which a predetermined operation has been performed is greater than or equal to the firsts threshold value and there is a programming command to be performed from among the received plurality of commands, the steps of comparing, searching, and programming are repeated.

19. The method of claim 18, wherein after the programming of the bank for which the predetermined operation has not been performed, the steps of comparing, searching, and programming are repeated when there is a programming command to be performed from among the received plurality of commands.

20. The method of claim 18, wherein the first threshold value is determined according to a maximum power level consumed by the non-volatile memory device.

* * * * *